United States Patent
Moon

(10) Patent No.: US 7,289,594 B2
(45) Date of Patent: Oct. 30, 2007

(54) SHIFT REGISTRER AND DRIVING METHOD THEREOF

(75) Inventor: Su Hwan Moon, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 135 days.

(21) Appl. No.: 10/963,510

(22) Filed: Oct. 14, 2004

(65) Prior Publication Data

US 2005/0220263 A1    Oct. 6, 2005

(30) Foreign Application Priority Data

Mar. 31, 2004    (KR)    ...................... 10-2004-0021986
Apr. 30, 2004    (KR)    ...................... 10-2004-0030337

(51) Int. Cl.
*G11C 19/00* (2006.01)
(52) U.S. Cl. .......................................... 377/68; 377/58
(58) Field of Classification Search .................... None
See application file for complete search history.

(56) References Cited

U.S. PATENT DOCUMENTS

| | | | |
|---|---|---|---|
| 5,949,398 A | 9/1999 | Kim | ........................... 345/100 |
| 6,052,426 A | 4/2000 | Maurice | ........................ 377/78 |
| 6,064,713 A | 5/2000 | Lebrun | ........................ 677/67 |
| 6,339,631 B1 | 1/2002 | Yeo et al. | ........................ 377/64 |
| 6,556,646 B1 * | 4/2003 | Yeo et al. | ........................ 377/54 |
| 6,690,347 B2 * | 2/2004 | Jeon et al. | .................. 345/100 |
| 6,845,140 B2 * | 1/2005 | Moon et al. | .................. 377/78 |
| 6,922,217 B2 * | 7/2005 | Kim | ............................. 349/43 |
| 2002/0149318 A1 | 10/2002 | Jeon et al. | ............... 315/169.1 |
| 2003/0043104 A1 * | 3/2003 | Lee et al. | ...................... 345/92 |
| 2005/0185752 A1 * | 8/2005 | Sasaki et al. | ................. 377/64 |

FOREIGN PATENT DOCUMENTS

| | | |
|---|---|---|
| EP | 0 651 395 A2 | 5/1995 |
| EP | 0731441 | 9/1996 |
| EP | 0 801 376 A2 | 10/1997 |

\* cited by examiner

*Primary Examiner*—Cassandra Cox
(74) *Attorney, Agent, or Firm*—Morgan, Lewis & Bockius LLP

(57) ABSTRACT

A shift register having a plurality of stages for shifting a start pulse and outputting a shifted start pulse to a next stage, each of the plurality of stages includes a pull-up transistor controlled by a first node to apply a first clock signal to an output line, a first pull-down transistor controlled by a second node to apply a first driving voltage to the output line, a controller for controlling the first and second nodes, and a compensating capacitor connected between the first node and an input line of a second clock signal, the second clock signal being different from the first clock signal.

12 Claims, 13 Drawing Sheets

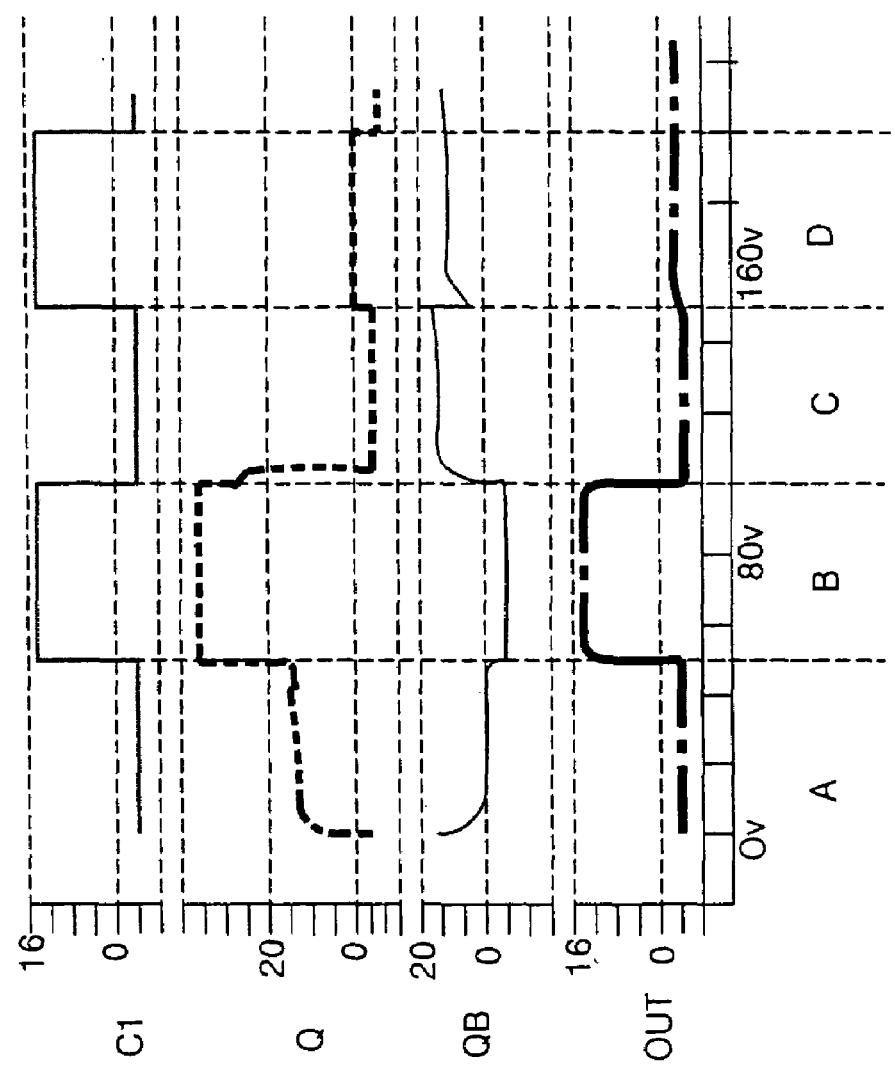

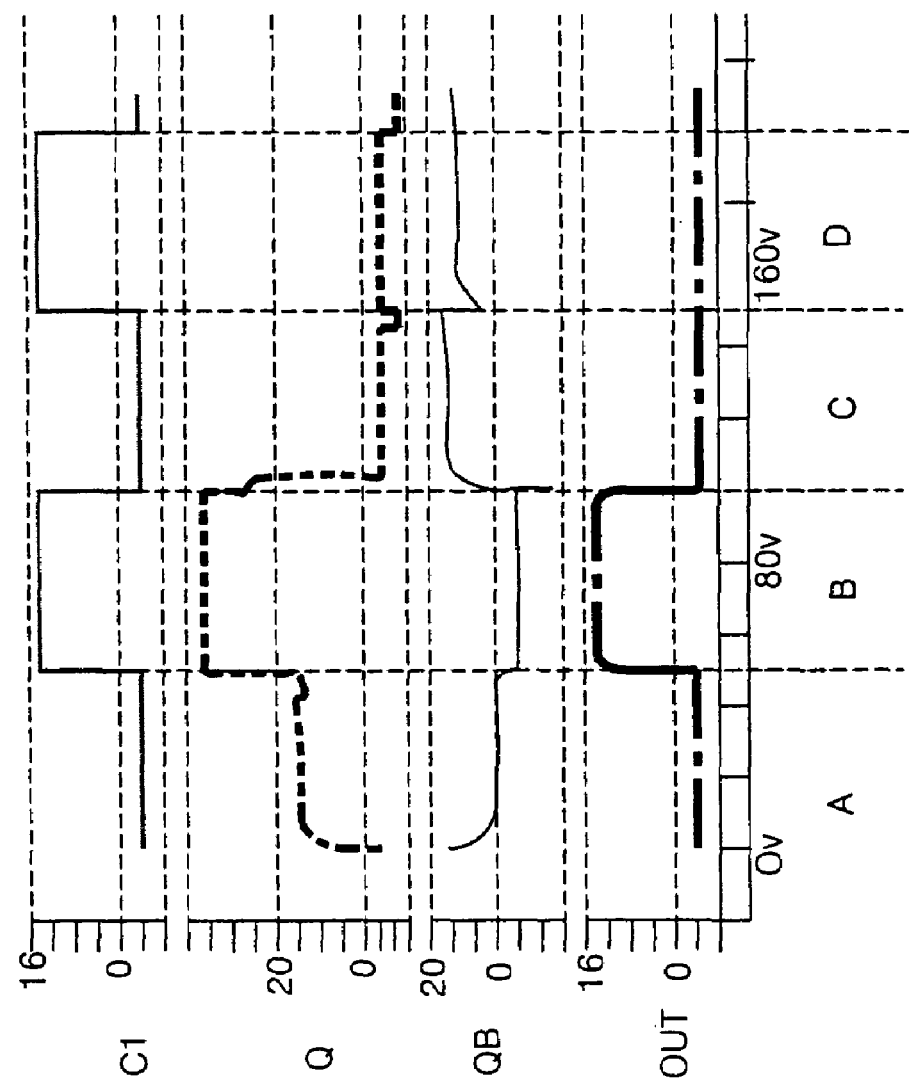

SHIFT REGISTRER AND DRIVING METHOD THEREOF

The present application claims the benefit of Korean Patent Application No. P2004-21986 filed in Korea on Mar. 31, 2004 and Korean Patent Application No. P2004-30337 filed in Korea on Apr. 30, 2004, which are hereby incorporated by reference.

BACKGROUND OF THE INVENTION

1. Field of the Invention

This invention relates to a driving circuit for a liquid crystal display, and more particularly, to a shift register employing an amorphous silicon thin film transistor that prevents a voltage at a node, which controls an output buffer, from being varied due to a parasitic capacitor of the thin film transistor.

2. Discussion of the Related Art

In general, liquid crystal display (LCD) devices are used in televisions, computers or portable devices. LCD devices use the optical anisotropy and polarization properties of liquid crystal molecules to generate a desired image. In particular, liquid crystal molecules can be aligned in a specific orientation, which can be controlled by applying an electric field across the liquid crystal molecules. Due to optical anisotropy, incident light is refracted according to the orientation of the liquid crystal molecules, thereby generating the desired image.

In addition, a LCD device generally includes a liquid crystal display panel having liquid crystal cells arranged in a matrix, and a driving circuit for driving the liquid crystal display panel. A liquid crystal display panel generally includes gate lines and data lines intersecting each other. A liquid crystal cell is positioned at each area defined by intersections between the gate lines and the data lines. The liquid crystal display panel also includes pixel electrodes and a common electrode for applying an electric field within each of the liquid crystal cells. Each of the pixel electrodes is connected, via source and drain terminals of a thin film transistor as a switching device, to one of the data lines. A gate terminal of the thin film transistor is connected to one of the gate lines.

The driving circuit includes a gate driver for driving the gate lines, and a data driver for driving the data lines. The gate driver applies a scanning signal to the gate lines to sequentially drive the liquid crystal cells row-by-row. The data driver applies a video signal to each data line whenever the scanning signal is applied to one of the gate lines. Thus, the LCD controls light transmittance by an electric field applied between the pixel electrode and the common electrode in accordance with the video signal for each liquid crystal cell, thereby displaying an image. In general, in such a driving circuit, the gate driver generates a scanning signal for sequentially driving the gate lines using a shift register. In addition, the data driver generates a sampling signal for sequentially sampling video signals inputted from the exterior thereof by a certain unit using the shift register.

FIG. 1 is a schematic block diagram showing a configuration of the related art two-phase shift register. In FIG. 1, a two-phase shift register includes first to nth stages connected in cascade. The first to nth stages are commonly supplied with a clock signal C1, an inverted clock signal /C1, a high-level driving voltage (not shown), and a low-level driving voltage (not shown). In addition, a start pulse Vst is applied to the first stage while an output signal from each of the first to (n−1)th the stages is applied to a respective next stage. The 1st to nth stages have an identical circuit configuration, and sequentially shift a specific voltage of the start pulse Vst. The 1st to nth output signals Out1 to Outn are supplied as scanning signals for sequentially driving the gate lines of the liquid crystal display panel, or as sampling signals for sequentially sampling video signals within the data driver.

FIG. 2 is a detailed circuit diagram of one stage shown in FIG. 1. In FIG. 2, a stage includes an output buffer 20 having a fifth NMOS transistor T5 for outputting a clock signal C1 to an output line OUT under the control of a first node Q, a sixth NMOS transistor T6 for outputting a low-level driving voltage VSS to the output line OUT under the control of a second node QB, and a controller 10 having first to fourth NMOS transistors T1 to T4 for controlling the first and second nodes Q and QB. The stage is supplied a high-level driving voltage VDD, a low-level driving voltage VSS, the start pulse Vst, the clock signal C1, and the inverted clock signal /C1.

FIG. 3 is a driving waveform diagram of the stage shown in FIG. 2. As shown in FIG. 3, during a first period A, the inverted clock signal /C1 is at a high state, thereby turning on the first transistor T1 and resulting a high-state of the start pulse Vst being applied to the first node Q. Thus, the fifth transistor T5 is turned on and applies a low state voltage of the clock signal C1 to the output line OUT. In addition, the high-level inverted clock signal /C1 turns on the second transistor T2, thereby resulting the high-level driving voltage VDD be applied to the second node QB. Thus, the sixth transistor T6 is turned on and applies the low-level driving voltage Vss to the output line OUT. As a result, during the first period A, the stage outputs a low-state output signal OUT.

During a second period B, the inverted clock signal /C1 is at a low state, thereby turning off the first transistor T1 and floating the first node Q at a high state. Thus, the fifth transistor T5 remains turned on. In addition, the clock signal C1 is at a high state and the floated first node Q is boot-strapped due to an effect of a second parasitic capacitor CGS (shown in FIG. 2). Accordingly, a voltage at the first node Q may be raised to certainly turn on the fifth transistor T5, thereby rapidly supplying a high-state voltage of the first clock signal C1 to the output line OUT. At the same time, the high-level clock signal C1 turns on the third transistor T3. The fourth transistor T4 also is turned on by the boot-strapped first node Q, thereby applying the low-level driving voltage VSS to the second node QB. Thus, the sixth transistor T6 is turned off. As a result, during the second period B, the stage outputs a high-state output signal OUT.

During a third period C, the inverted clock signal /C1 is at the high state, thereby turning on the first transistor T1 and resulting a low-state voltage of the start pulse Vst being applied to the first node Q. Thus, the fifth transistor T5 is turned off. At the same time, the high-state inverted clock signal /C1 turns on the second transistor T2, thereby applying the high-level driving voltage VDD to the second node QB. Thus, the sixth transistor T6 is turned on and applies the low-level driving voltage VSS to the output line OUT. In addition, the third transistor T3 is turned off by a low-level clock signal C1, and the fourth transistor T4 is turned off by the low-level first node Q. As a result, during the third period C, the stage outputs the low-state output signal OUT.

During a fourth period D, the inverted clock signal /C1 is at a low state, thereby turning off the first and second transistors T1 and T2. Thus, the first node Q floats to its previous low state, to thereby turn off the fifth transistor T5. Thus, the fourth transistor T4 is turned off by the low-level first node Q. At the same time, the high-level first clock signal C1 turns on the third transistor T3. Thus, the second node QB node floats at a high state somewhat lowered than the high-level driving voltage VDD supplied in the previous period C. Accordingly, the sixth transistor T6 is turned on and applies the low-level driving voltage VSS to the output line OUT. As a result, during the fourth period D, the stage may output the low-state output signal OUT.

However, since each of the first to sixth NMOS transistors T1 to T6 formed by an amorphous silicon thin film transistor process has a structure in which the gate electrode/terminal overlaps the source and drain electrodes/terminals thereof, it inevitably includes parasitic capacitors CGD and CGS. Moreover, as sizes of the fifth and sixth NMOS transistors T5 and T6 are considerably enlarged to compensate a low mobility of the amorphous silicon thin film transistor, values of the parasitic capacitors CGD and CGS also are increased.

Although the parasitic capacitor CGS formed at an overlapping portion between the gate electrode and the source electrode of the fifth NMOS transistor T5 aids the bootstrapping of the first node Q, the parasitic capacitor CGD formed at an overlapping portion between the gate electrode and the drain electrode of the fifth NMOS transistor T5 causes a problem. For example, the parasitic capacitor CGD varies a voltage at the floated Q node whenever the clock signal C1 transitioning from a low state into a high state and causes a swing in the output voltage Vout. As shown in FIG. 3, a voltage at the first node Q floated into a low state by the clock signal C1 transitioning into a high state in the D period is varied into a somewhat higher state. Hence, the output voltage Vout also slightly rises from a low-level voltage and has a distortion. Since the output voltage Vout distorted in this manner is used as an input of the next stage, as it goes through a number of stages, a distortion amount in the output voltage Vout increases and causes a significant error in the LCD device operation.

SUMMARY OF THE INVENTION

Accordingly, the present invention is directed to a shift register and a driving method thereof that substantially obviate one or more of the problems due to limitations and disadvantages of the related art.

An object of the present invention is to provide a shift register and a driving method thereof that prevent a voltage at a node, which controls an output buffer, from being varied due to a parasitic capacitor of a thin film transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the shift register having a plurality of stages for shifting a start pulse and outputting a shifted start pulse to a next stage, each of the plurality of stages includes a pull-up transistor controlled by a first node to apply a first clock signal to an output line, a first pull-down transistor controlled by a second node to apply a first driving voltage to the output line, a controller for controlling the first and second nodes, and a compensating capacitor connected between the first node and an input line of a second clock signal, the second clock signal being different from the first clock signal.

In another aspect, the method of driving a shift register having a plurality of stages for shifting a start pulse and outputting a shifted start pulse to a next stage, each of the plurality of stages comprising a pull-up transistor controlled by a first node to apply a first clock signal to an output line, a first pull-down transistor controlled by a second node to apply a first driving voltage to the output line, a controller for controlling the first and second nodes, and a compensating capacitor connected between the first node and an input line of a second clock signal, the second clock signal being different from the first clock signal, includes floating the first node, and varying a voltage at the floated first node in an opposite direction along a transition voltage of the second clock signal transferred via the compensating capacitor.

In yet another aspect, the driving device for a liquid crystal display panel device including a shift register having a plurality of stages for shifting a start pulse and outputting a shifted start pulse to a next stage, each of the plurality of stages includes a pull-up transistor controlled by a first node to apply a first clock signal to an output line, a first pull-down transistor controlled by a second node to apply a first driving voltage to the output line, a controller for controlling the first and second nodes, and a compensating capacitor connected between the first node and an input line of a second clock signal, the second clock signal being different from the first clock signal.

In another aspect, the shift register having a plurality of stages for shifting a start pulse and outputting a shifted start pulse to a next stage, each of said plurality of stages includes a pull-up transistor controlled by a first node to apply a first clock signal to an output line, a pull-down transistor controlled by a second node to apply a first driving voltage to the output line, a controller for controlling the first and second nodes, and a compensating circuit connected to the first node, the compensating circuit selectively applying the first driving voltage to the first node.

In yet another aspect, the method of driving a shift register having a plurality of stages for shifting a start pulse and outputting a shifted start pulse to a next stage, each of said plurality of stages including a pull-up transistor controlled by a first node to apply a first clock signal to an output line, a pull-down transistor controlled by a second node to apply a first driving voltage to the output line, a controller for controlling the first and second nodes, and a compensating circuit connected to the first node, includes selectively applying the first driving voltage to the first node by the compensating circuit.

In another aspect, the driving device for a liquid crystal display panel device includes a shift register having a plurality of stages for shifting a start pulse and outputting a shifted start pulse to a next stage, each of said plurality of stages comprising a pull-up transistor controlled by a first node to apply a first clock signal to an output line, a pull-down transistor controlled by a second node to apply a first driving voltage to the output line, a controller for controlling the first and second nodes, and a compensating circuit connected to the first node, the compensating circuit selectively applying the first driving voltage to the first node.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 8A and FIG. 8B are driving waveform diagrams showing the effects of the compensating capacitor CC in the stage shown in FIG. 6.

DETAILED DESCRIPTION OF THE PREFERRED EMBODIMENTS

Reference will now be made in detail to the preferred embodiments, examples of which are illustrated in the accompanying drawings.

Figure 4:
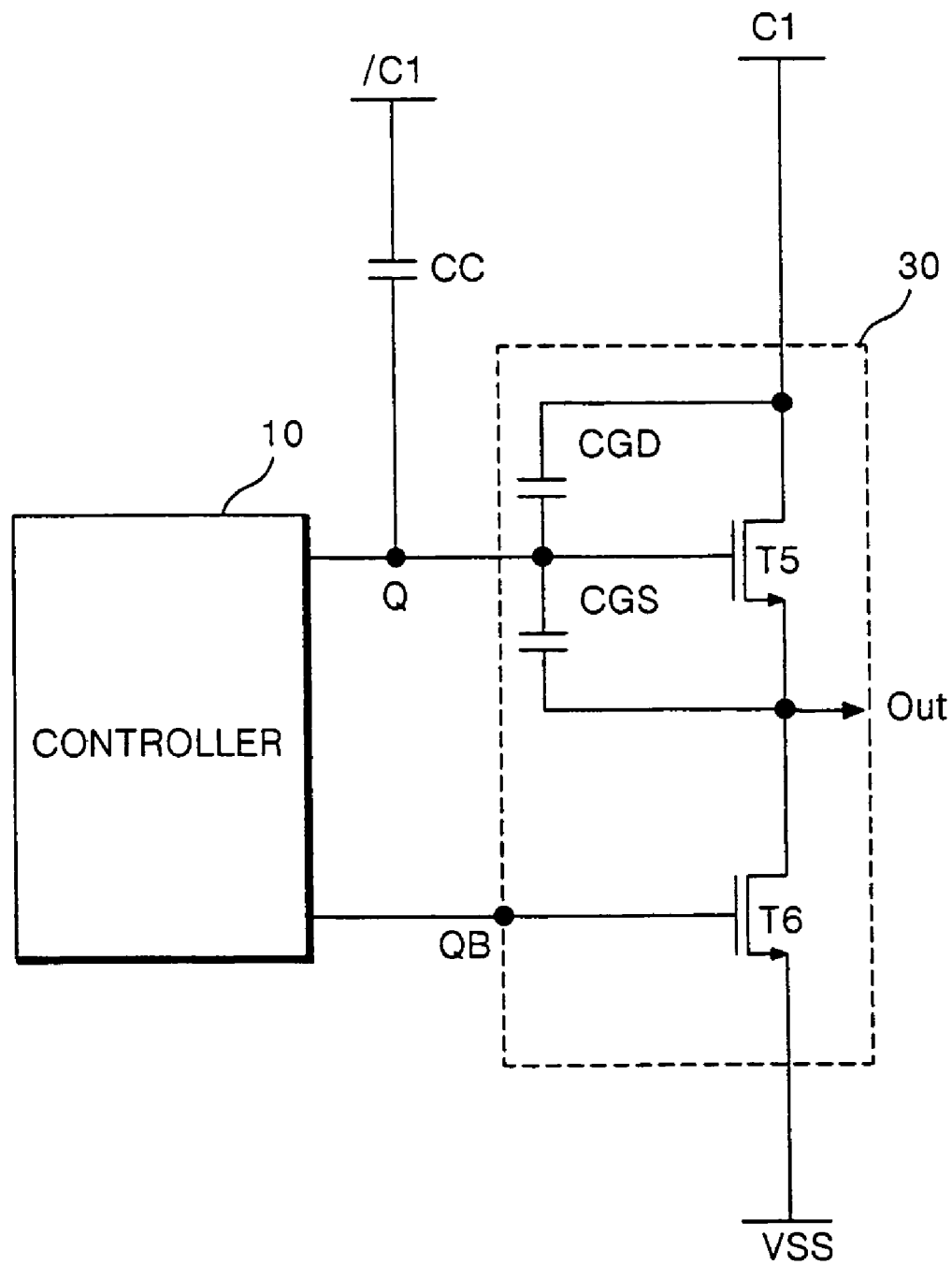
FIG. 4 is a circuit diagram showing an output portion of one stage of a shift register according to an embodiment of the present invention.
Figure 5:
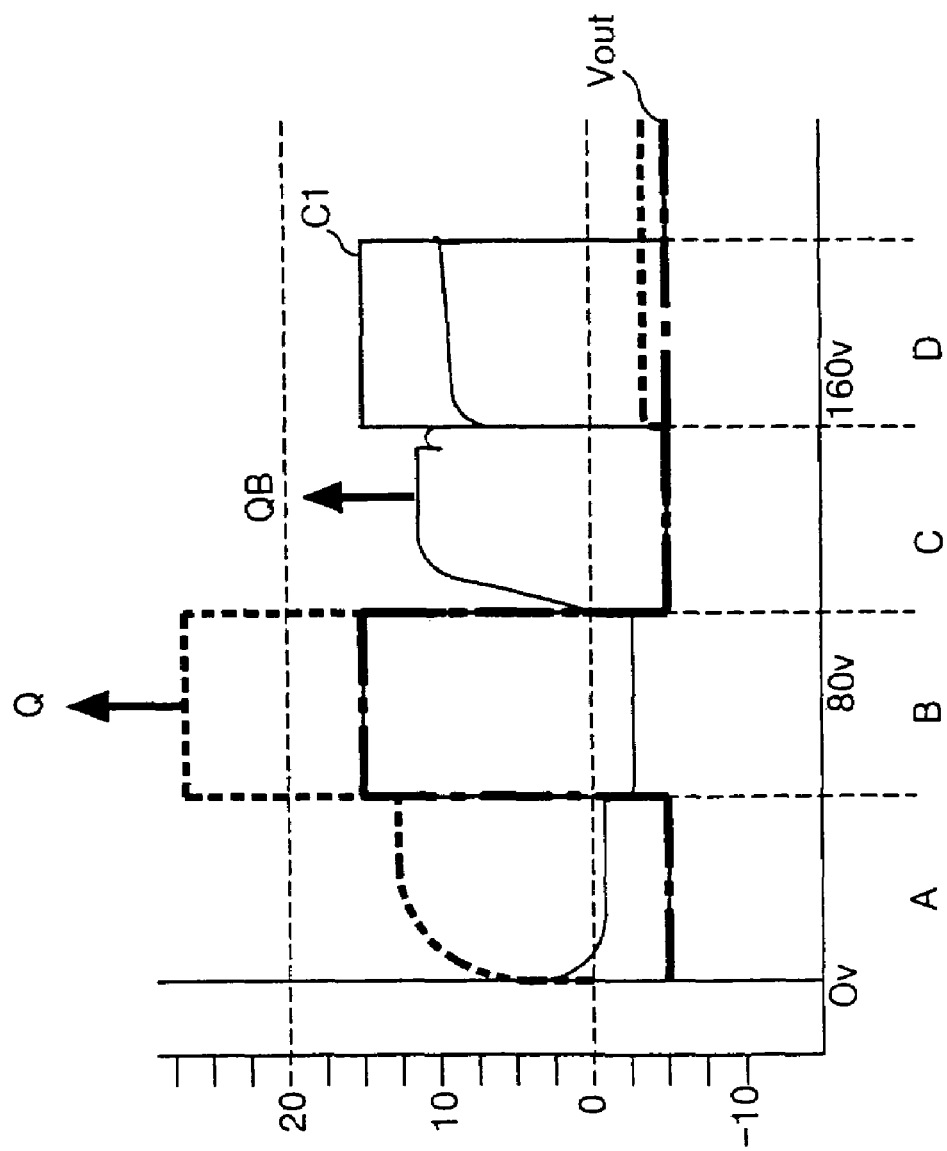
FIG. 5 is a driving waveform diagram of the stage shown in FIG. 4.

FIG. 4 is a circuit diagram showing an output portion of one stage of a shift register according to an embodiment of the present invention and FIG. 5 is a driving waveform diagram of the stage shown in FIG. 4. In FIG. 4, a stage of a shift register may include an output buffer 30 having a fifth transistor T5 for outputting a clock signal C1 to a output line OUT under the control of a first node Q, and a sixth transistor T6 for outputting a low-level driving voltage VSS to the output line OUT under the control of a second node QB. The fifth T5 may be a pull-up transistor and may include a NMOS transistor. In addition, the sixth transistor T6 may be a pull-down transistor and may include a NMOS transistor. A source terminal of the fifth transistor T5 may be connected to a drain terminal of the sixth transistor T6. Because the fifth transistor T5 may have a structure where its gate electrode/terminal overlaps its source and drain electrodes/terminals, a first parasitic capacitor CGD may be considered to be between a gate terminal and a drain terminal of the fifth transistor T5, and a second parasitic capacitor CGS may be considered to be between the gate terminal of the fifth transistor T5, the source terminal of the fifth transistor T5, and the drain terminal of the sixth transistor T6.

In addition, a controller 10 may be provided for controlling the first and second nodes Q and QB. The controller 10 may be configured having the first to fourth NMOS transistors T1 to T4 shown in FIG. 2, but may have any configuration capable of controlling the first and second nodes Q and QB. Further, a compensating capacitor CC may be included for compensating a voltage variation at the first node Q. The compensating capacitor CC may be connected between the first node Q and a supply source providing an inverted clock signal /C1. As a result, the compensating capacitor CC may allow a voltage contrary to a parasitic capacitor CGD to be applied to the first node Q, thereby preventing a voltage variation at the first node Q.

In particular, because a capacitance of the compensating capacitor CC may be greater than a capacitance of the first parasitic capacitor CGD, the first node Q may respond to a transition of the inverted clock signal /C1 prior to a transition of the clock signal C1, i.e., the inverted clock signal /C1 and the compensating capacitor CC may vary at the first node Q in a direction contrary to the clock signal C1. For example, as shown in FIG. 5, when the clock signal C1 transits from a low state into a high state at the boundary of C and D periods, the first node Q may change to a low-level with an initial state caused by the first parasitic capacitor CGD. Thus, it becomes possible to reduce a distortion of a output voltage Vout.

Figure 1:
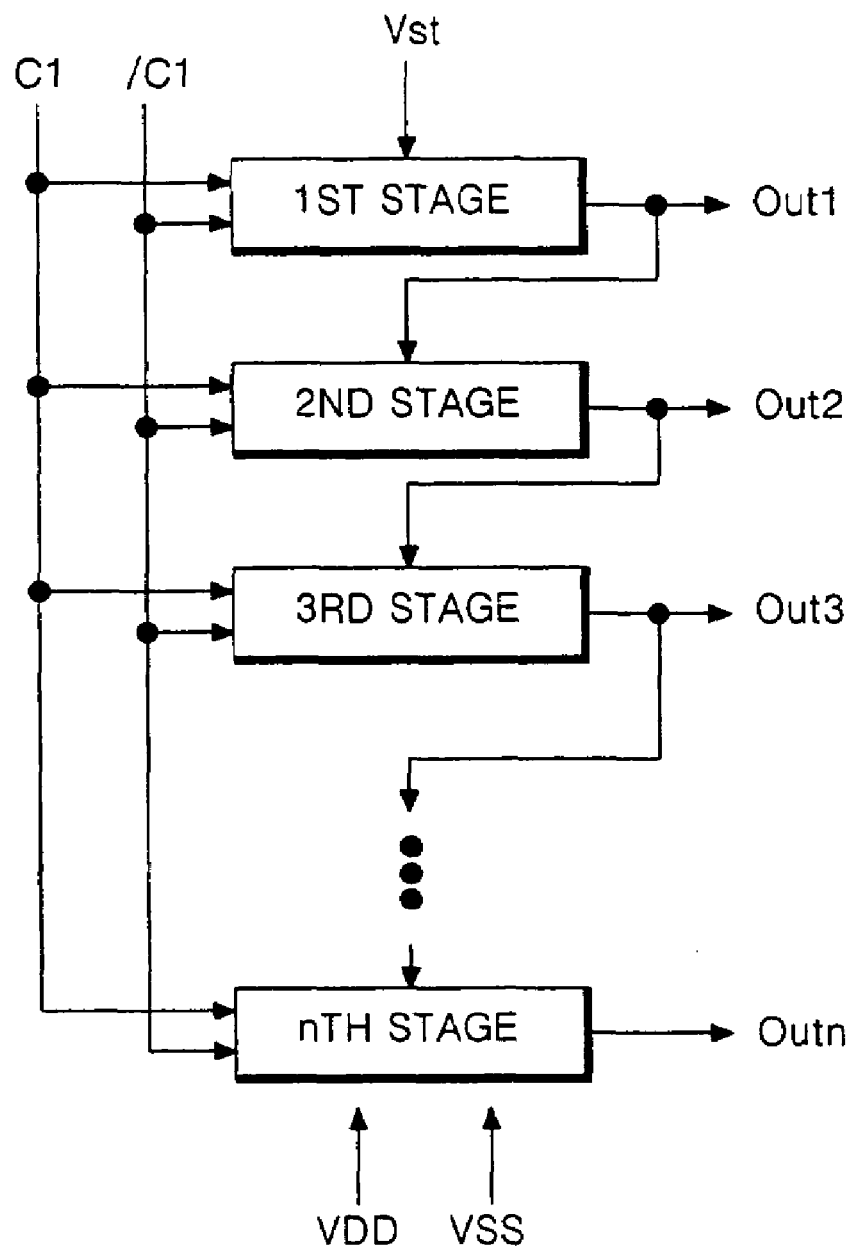
FIG. 1 is a schematic block diagram showing a configuration of the related art two-phase shift register.
Figure 2:
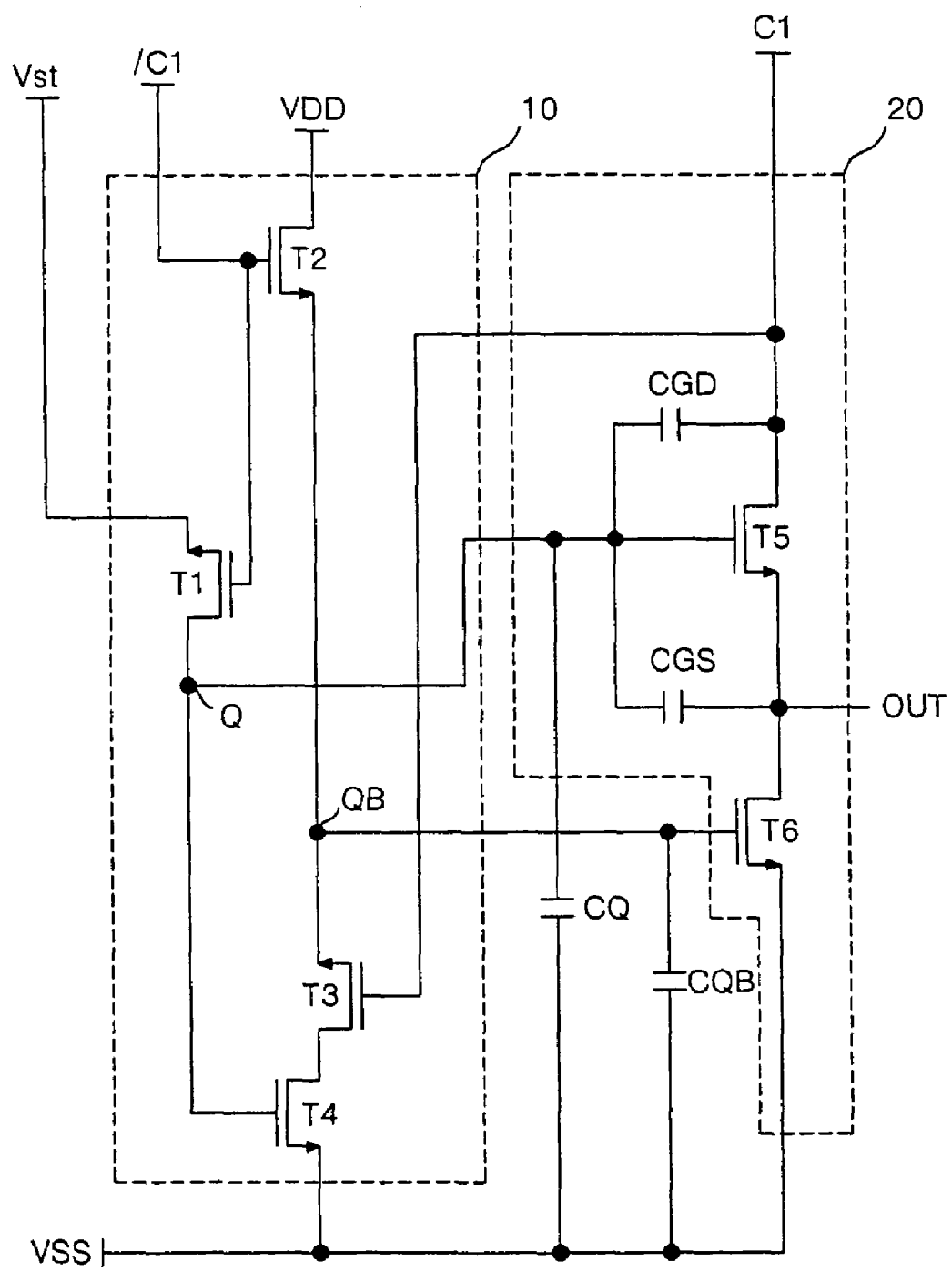
FIG. 2 is a detailed circuit diagram of one stage shown in FIG. 1.

In addition, FIG. 5 shows a driving waveform diagram of the stage of FIG. 4, where the controller 10 has the same configuration shown in FIG. 2. During a first period A, the inverted clock signal /C1 may be at a high state, thereby turning on the first transistor T1 and resulting a high-state of the start pulse Vst being applied to the first node Q. Thus, the fifth transistor T5 may be turned on and may apply a low state voltage of the clock signal C1 to the output line OUT. In addition, the high-level inverted clock signal /C1 may turn on the second transistor T2, thereby resulting the high-level driving voltage VDD be applied to the second node QB. Thus, the sixth transistor T6 may be turned on and may apply the low-level driving voltage Vss to the output line OUT. As a result, during the first period A, the stage may output a low-state output signal OUT.

During a second period B, the inverted clock signal /C1 may be at a low state, thereby turning off the first transistor T1 and floating the first node Q at a high state. Thus, the fifth transistor T5 may remain turned on. In addition, the clock signal C1 may be at a high state and the floated first node Q may be boot-strapped due to an effect of the second parasitic capacitor CGS. Accordingly, a voltage at the first node Q may be raised to certainly turn on the fifth transistor T5, thereby rapidly supplying a high-state voltage of the first clock signal C1 to the output line OUT. At the same time, the high-level clock signal C1 may turn on the third transistor T3. The fourth transistor T4 also may be turned on by the boot-strapped first node Q, thereby applying the low-level driving voltage VSS to the second node QB. Thus, the sixth transistor T6 may be turned off. As a result, during the second period B, the stage may output a high-state output signal OUT.

During a third period C, the inverted clock signal /C1 again may be at the high state, thereby turning on the first transistor T1 and resulting a low-state voltage of the start pulse Vst being applied to the first node Q. Thus, the fifth transistor T5 may be turned off. At the same time, the high-state inverted clock signal /C1 may turn on the second transistor T2, thereby applying the high-level driving voltage VDD to the second node QB. Thus, the sixth transistor T6 may be turned on and may apply the low-level driving voltage VSS to the output line OUT. In addition, the third transistor T3 may be turned off by a low-level clock signal C1, and the fourth transistor T4 may be turned off by the low-level first node Q. As a result, during the third period C, the stage may output the low-state output signal OUT.

During a fourth period D, the inverted clock signal /C1 may be at a low state, thereby turning off the first and second transistors T1 and T2. Thus, the first node Q may be floated to its previous low state, to thereby turn off the fifth transistor T5. Thus, the fourth transistor T4 may be turned off by the low-level first node Q. At the same time, the high-level first clock signal C1 may turn on the third transistor T3. Thus, the second node QB node may be floated at a high state somewhat lowered than the high-level driving voltage VDD supplied in the previous period C. Accordingly, the sixth transistor T6 may be turned on and may apply the low-level driving voltage VSS to the output line OUT. As a result, during the fourth period D, the stage may output the low-state output signal OUT.

Figure 3:
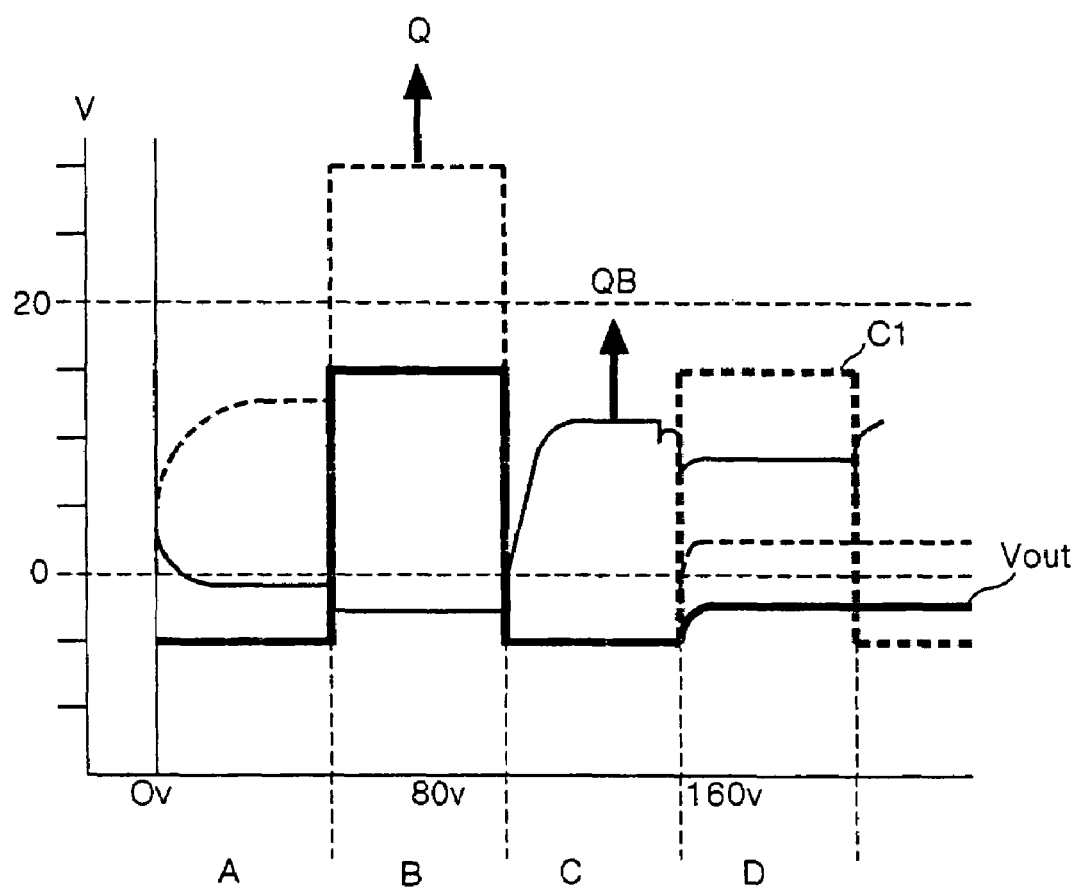
FIG. 3 is a driving waveform diagram of the stage shown in FIG. 2.

Unlike the related art shown in FIG. 3, as shown in FIG. 5, at an initial point of the fourth period D, the inverted clock signal /C1 is transferred, via the compensating capacitor CC, to the first node Q before the clock signal C1 transited from a low state into a high state is transferred via the parasitic capacitor CGD of the fifth transistor T5 thereto. Thus, a voltage at the first node Q can be more lowered along a falling inverted clock signal /C1 and then can be returned into an initial low-state voltage along a rising clock signal C1.

Further, although not shown, during the remaining period, the stage may repeat the operation during the third and fourth periods, C and D, such that the stage may continue to output the low-state output signal OUT. In addition, although not shown, the stage shown in FIG. 4 may be cascaded with other stages in the shift register.

Figure 6:
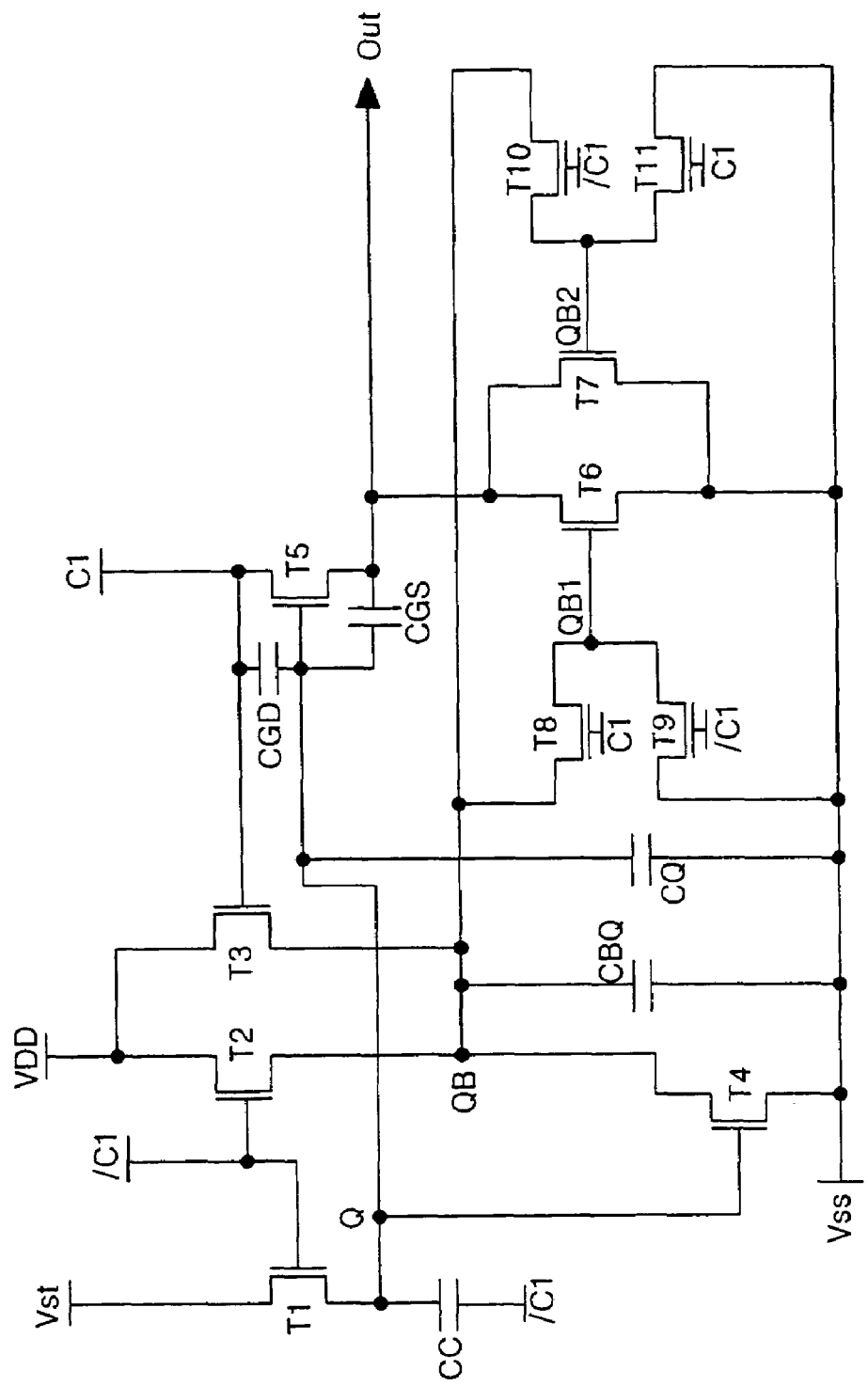
FIG. 6 is a detailed circuit diagram of one stage of a shift register according to another embodiment of the present invention.

FIG. 6 is a detailed circuit diagram of one stage of a shift register according to another embodiment of the present invention. In FIG. 6, each stage of a shift register may include an output buffer having a fifth transistor T5 for outputting a clock signal C1 to a first output line under the control of a first node Q, and sixth and seventh transistors T6 and T7 for outputting a low-level driving voltage VSS to a second output line under the control of second and third nodes QB1 and QB2.

The fifth T5 may be a pull-up transistor and may include a NMOS transistor. In addition, the sixth and seventh transistors T6 and T7 may be parallel to each other and may form a pull-down transistor. The sixth and seventh transistors T6 and T7 may include NMOS transistors. A source terminal of the fifth transistor T5 may be connected to a drain terminal of the sixth transistor T6 and a drain terminal of the seventh transistor T7. Because the fifth transistor T5 may have a structure where its gate electrode/terminal overlaps its source and drain electrodes/terminals, a first parasitic capacitor CGD may be considered to be connected between a gate terminal and a drain terminal of the fifth transistor T5, and a second parasitic capacitor CGS may be considered to be connected to the gate terminal of the fifth transistor T5, the source terminal of the fifth transistor T5, the drain terminal of the sixth transistor T6, and the drain terminal of the seventh transistor T7.

In addition, each stage of a shift register may include a first transistor T1 for controlling the first node Q, second, third and fourth transistors T2, T3 and T4 for controlling a fourth node QB, eighth and ninth transistors T8 and T9 for controlling the second node QB1, and tenth and eleventh transistors T10 and T11 for controlling the third node QB2. The first transistor T1 may include a NMOS transistor receiving a start pulse Vst and receiving a second clock signal /C1 via a compensating capacitor CC for compensating a voltage variation at the first node Q. A gate terminal of the first transistor T1 may connect to a gate terminal of the second transistor T2. The second transistor T2 may be a NMOS transistor receiving the second clock signal /C1 and a high-level driving voltage VDD. The second transistor T2 also may be connected to the fourth node QB. The third transistor T3 may include a NMOS transistor receiving a first clock signal C1 and being parallel to the second transistor T2. Further, the fourth NMOS transistor T4 may include a NMOS transistor receiving a low-voltage driving VSS and being connected to the fourth QB.

The eighth transistor T8 may include a NMOS transistor receiving the first clock signal C1 and being connected between the second node QB1 and the fourth node QB. The ninth transistor T9 may include a NMOS transistor receiving the second clock signal /C1 and the low-level driving voltage VSS and being connected to the second node QB1. In addition, the tenth transistor T10 may include a NMOS transistor receiving the second clock signal /C1 and being connected between the third node QB2 and the fourth node QB. The eleventh transistor T11 may include a NMOS transistor receiving the first clock signal C1 and the low-level driving voltage VSS and being connected to the third node QB2.

A first capacitor CQ may be connected between the first node Q and an input line of the low-level driving voltage VSS for eliminating noise at the first node Q. Similarly, a second capacitor CBQ may be connected between the fourth node QB and the input line of the low-level driving voltage VSS for eliminating noise at the fourth node QB.

Figure 7:
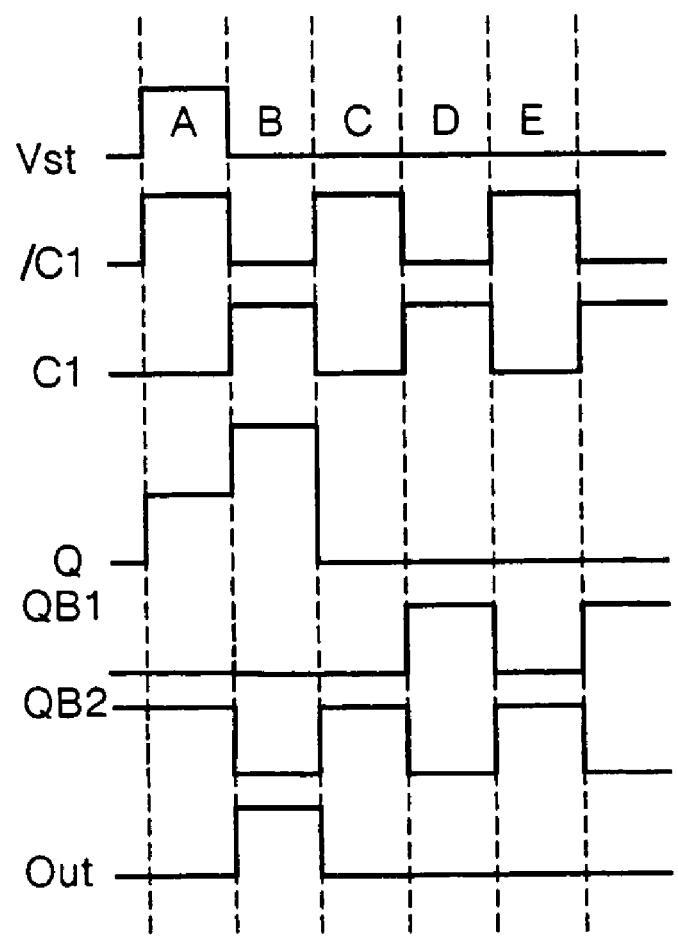
FIG. 7 is a driving waveform diagram of the stage shown in FIG. 6.

FIG. 7 is a driving waveform diagram of the stage shown in FIG. 6. As shown in FIG. 7, during a first period A, the second clock signal /C1 may be at a high state, thereby turning on the first transistor T1 and resulting a high-state of the start pulse Vst being applied to the first node Q. Thus, the fifth transistor T5 may be turned on and may apply a low state voltage of the clock signal C1 to the output line. In addition, the high-level second clock signal /C1 may turn on the second, ninth and tenth transistors T2, T9 and T10. By turning on the second, ninth and tenth transistors T2, T9, and T10, the high-level driving voltage VDD may be applied to the fourth node QB and the third node QB2, while the low-level driving voltage Vss may be applied to the second node QB1. Thus, the seventh transistor T7 may be turned on and may apply the low-level driving voltage VSS to the output line. As a result, during the first period A, the stage may output a low-state output signal OUT.

During a second period B, the second clock signal /C1 may be at a low state, thereby turning off the first transistor T1 and floating the first node Q at a high state. Thus, the fifth transistor T5 may remain turned on. In addition, the first clock signal C1 may be at a high state and the floated first node Q may be boot-strapped due to an effect of a second parasitic capacitor CGS. Accordingly, a voltage at the first node Q may be raised to certainly turn on the fifth transistor T5, thereby rapidly supplying a high-state voltage of the first clock signal C1 to the output line. At the same time, the high-level first clock signal C1 may turn on the third, eighth and eleventh transistors T3, T8 and T11. The fourth transistor T4 may be turned on by the boot-strapped first node Q, thereby applying the low-level driving voltage VSS to the fourth node QB and changing the fourth node QB to a low level. Thus, the second node QB1 and the third node QB2 may be at a low state. Accordingly, the sixth and seventh transistors T6 and T7 may be turned off. As a result, during the second period B, the stage may output a high-state output signal OUT.

During a third period C, the second clock signal /C1 again may be at the high state, thereby turning on the first transistor T1 and resulting a low-state voltage of the start pulse Vst being applied to the first node Q. Thus, the fifth transistor T5 may be turned off. At the same time, the second clock signal /C1 may turn on the second transistor T2, thereby applying the high-level driving voltage VDD to the fourth node QB. Further, the second clock signal /C1 also may turn on the ninth and tenth transistors T9 and T10, thereby applying the low-level driving voltage VSS to the second node QB1 and applying the high-level driving voltage VDD supplied to the fourth node QB to the third node QB2. Accordingly, the seventh transistor T7 may be turned on and may apply the low-level driving voltage VSS to the output line. As a result, during the third period C, the stage may output the low-state output signal OUT.

During a fourth period D, the second clock signal /C1 may be at a low state, thereby turning off the first and second transistors T1 and T2. Thus, the first node Q may be floated to its previous low state, to thereby turn off the fifth transistor T5. At the same time, the high-level first clock signal C1 may turn on the third, eighth and eleventh transistors T3, T8 and T11. Thus, the high-level driving voltage VDD may be applied to the fourth node QB node and then to the second node QB1, while the low-level driving voltage Vss may be applied to the third node QB2. Thus, the sixth NMOS transistor T6 may be turned on and may apply the low-level driving voltage VSS to the output line. As a result, during the fourth period D, the stage may output the low-state output signal OUT.

Although not shown, during the remaining period, the stage may repeat the operation during the third and fourth periods, C and D, such that the stage may continue to output the low-state output signal OUT. In addition, although not shown, the stage shown in FIG. 4 may be cascaded with other stages in the shift register.

Since the sixth and seventh transistors T6 and T7 may be parallel to each other, the sixth and seventh transistors T6 and T7 may operate in opposite manners by an alternating current (AC) driving of the second node QB1 and the third node QB2. The AC driving may include applying the first and second clock signals C1 and /C2 to the gate terminals of the sixth and seventh transistors T6 and T7. Thus, a direct current (DC) bias may be prevented from being applied to the gate terminals of the sixth and seventh transistors T6 and T7, thereby preventing the sixth and seventh transistors T6 and T7 from being erroneously operated due to a gate bias stress at a high-temperature driving. Although forming the pull-down circuit with the sixth and seventh transistors T6 and T7, instead of one transistor as shown in FIG. 4, may cause a size reduction, the sixth and seventh transistors have a relatively small size.

FIG. 8A and FIG. 8B are driving waveform diagrams showing the effects of the compensating capacitor CC in the stage shown in FIG. 6. As shown in FIG. 8A, a distortion may occur in the output voltage Vout, e.g., the fourth period D, if the stage shown in FIG. 6 does not include the compensating capacitor CC. Such a distortion may occur due to a varying in the voltage at the first node Q caused by the first parasitic capacitor CGD and the first clock signal C1.

However, as shown in FIG. 8B, the compensating capacitor CC (shown in FIG. 6) may allow the second clock signal /C1 transitioning from a high state into a low state to be transferred to the first node Q before the first clock signal C1 transitioning from a low state into a high state is transferred, via the parasitic capacitor CGD. Thus, a voltage at the first node Q may be more lowered along a falling second clock signal /C1 and then returned to an initial low-stage voltage along a rising first clock signal C1. As a result, it becomes possible to reduce a distortion in the output voltage Vout.

Figure 9:
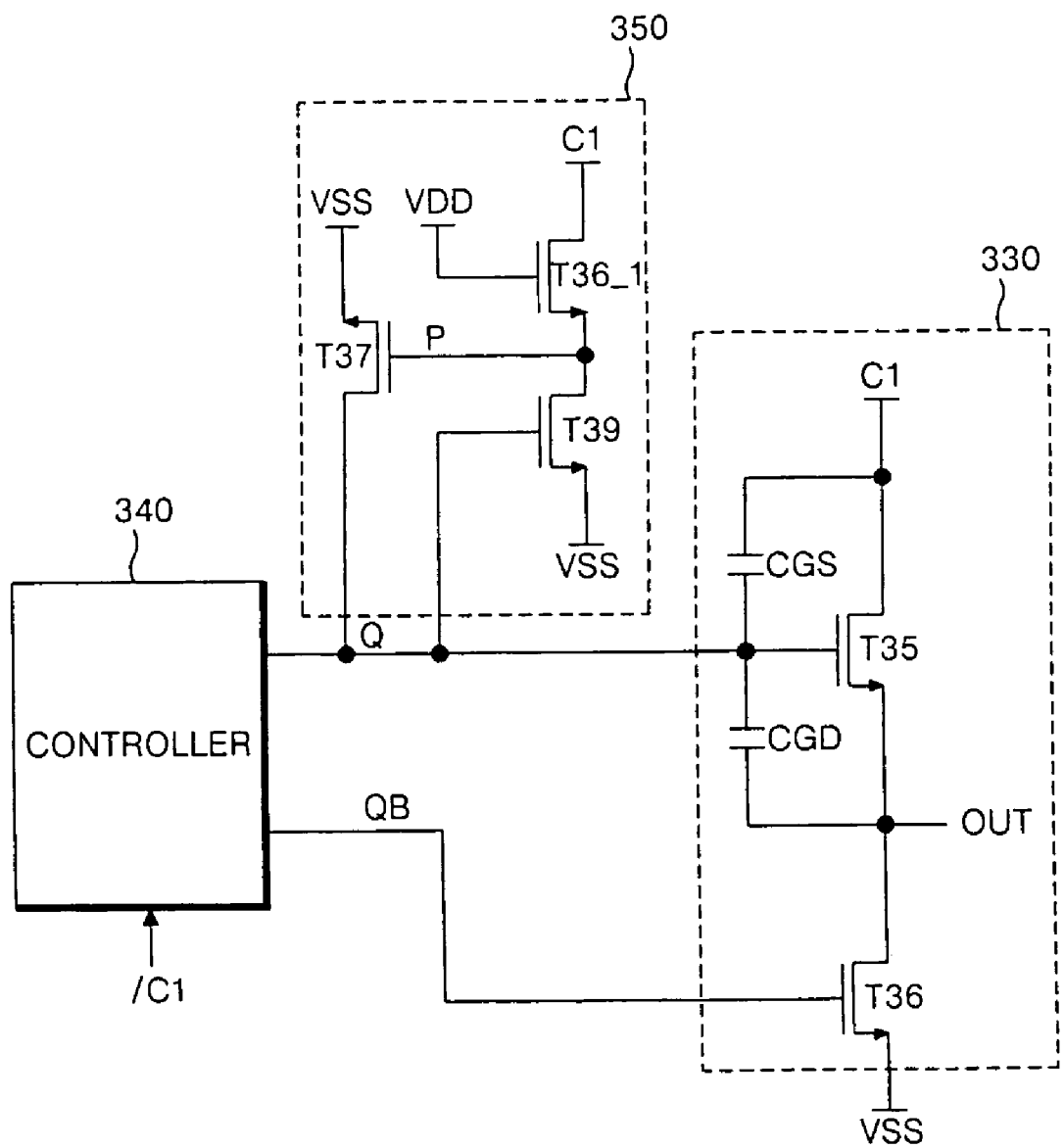
FIG. 9 is a detailed circuit diagram of one stage of a shift register according to another embodiment of the present invention.

FIG. 9 is a detailed circuit diagram of one stage of a shift register according to another embodiment of the present invention. In FIG. 9, each stage of a shift register may include an output buffer 330 having a pull-up transistor T35 for outputting a first clock signal C1 to an output line OUT under the control of a first node Q, and a pull-down transistor T36 for outputting a low-level voltage VSS to the output line OUT under the control of a second node QB.

Each stage also may include a compensating circuit 350 for compensating for a voltage variation in the first node Q. The compensating circuit 350 includes a first compensating transistor T36_1, a second compensating transistor T37, and a third compensating transistor T39. The first compensating transistor T36_1 may always be turned-on by a high-level voltage VDD and may apply the first clock signal C1 to a third node P. In addition, the second compensating transistor T37 may be controlled by the voltage at the third node P to selectively apply the low-level voltage VSS to the first node Q.

Further, the third compensating transistor T39 may be controlled by the voltage at the first node Q to selectively apply the low-level voltage VSS to the third node P. The third compensating transistor T39 may be much larger than the first compensating transistor T36_1, thereby reducing a stress level experienced by the first compensating transistor T36_1. For example, a magnitude relationship of the third compensating transistor T39 to the first compensating transistor T36_1 may have a ratio of approximately 3:1. Thus, the first compensating transistor T36_1 may be less likely deteriorated due to stress and may have a longer life span.

Accordingly, the compensating circuit 350 supplies the low-level voltage VSS to the first node Q every period D when the first clock signal C1 becomes a high state after a high state output OUT was generated from one stage, thereby preventing the first node Q from being floated into a low state. In other words, the compensating circuit 350 prevents the first node Q from being floated into a low state and thus prevents a voltage variation at the first node Q caused by a coupling of a second parasitic capacitor CGS of the pull-up transistor T35. Accordingly, it becomes possible to prevent a distortion of the output signal OUT caused by a voltage variation in the first node Q.

Moreover, a controller 340 may be provided for controlling the first and second nodes Q and QB. The controller 340 may receive a second clock signal /C1. The second clock signal /C1 may be an inverted signal of the first clock signal C1 and needs not be an exact inversion of the first clock signal C1. The controller 340 may be configured having the first to fourth NMOS transistors T1 to T4 shown in FIG. 2, but may have any configuration capable of controlling the first and second nodes Q and QB.

Figure 10:
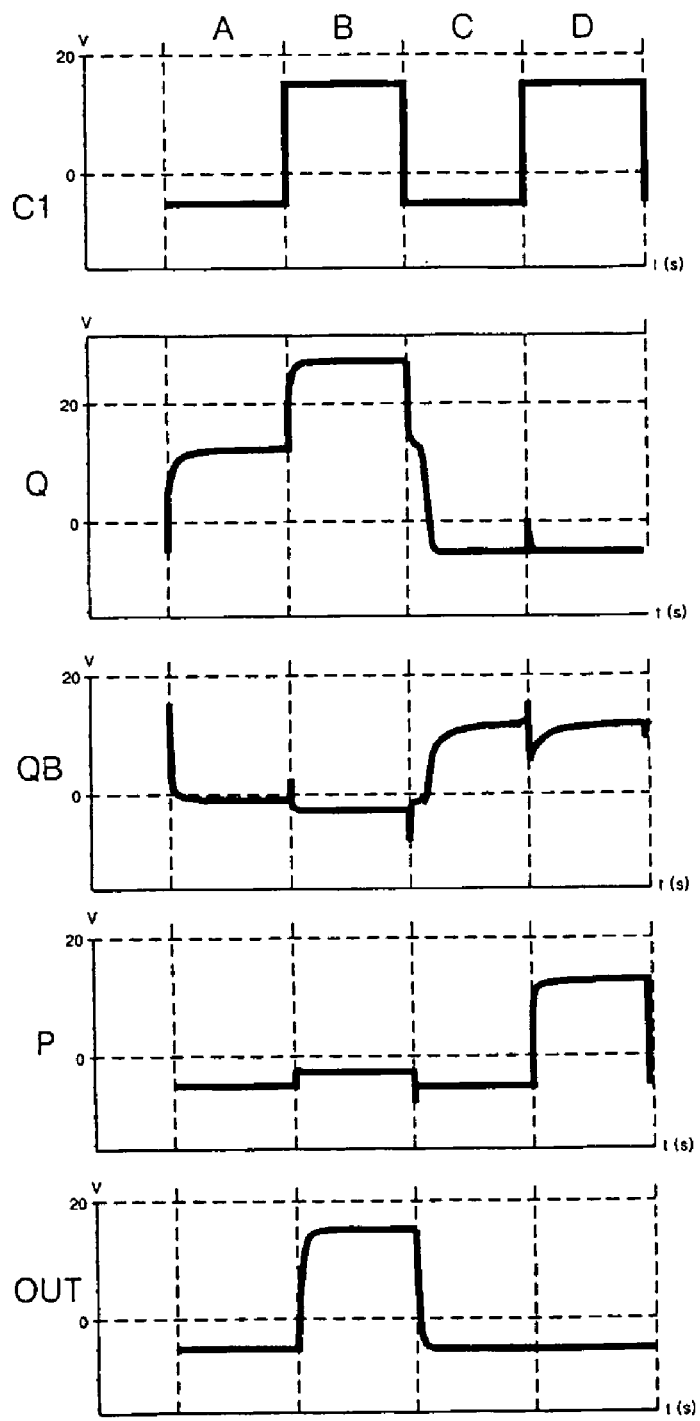
FIG. 10 is a driving waveform diagram of the stage shown in FIG. 9.

FIG. 10 is a driving waveform diagram of the stage shown in FIG. 9. As shown in FIG. 10, during a first period A, the first clock signal C1 may be at a low state, and although not shown, the second clock signal /C1 may be at a high state. Thus, the first transistor T1 (shown in FIG. 2) is turned on and a high-state of the start pulse Vst is applied to the first node Q. Thus, the pull-up transistor T5 may be turned on and may apply a low state voltage of the first clock signal C1 to the output line OUT. Meanwhile, the second node QB and the third node P may be at a low state. As a result, during the first period A, the stage may output a low-state output signal OUT.

During a second period B, the first clock signal C1 may be at a high state and the second clock signal /C1 may be at a low state. Thus, the first transistor T1 (shown in FIG. 2) is turned off and the first node Q is floated at a high state. Because the first node Q is floated at the high state, the third compensating transistor T39 (shown in FIG. 9) is on and applies the low-level voltage to the third node P. In addition, the clock signal C1 may be at a high state and the floated first node Q may be boot-strapped due to an effect of the second parasitic capacitor CGS of the pull-up transistor T35 Accordingly, a voltage at the first node Q may be raised to certainly turn on the pull-up transistor T35, thereby rapidly supplying a high-state voltage of the first clock signal C1 to the output line OUT. At the same time, the high-level clock signal C1 may turn on the third transistor T3 (shown in FIG. 2). The fourth transistor T4 (shown in FIG. 2) also may be turned on by the boot-strapped first node Q, thereby applying the low-level driving voltage VSS to the second node QB. As a result, during the second period B, the stage may output a high-state output signal OUT.

During a third period C, the first clock signal C1 may be at the low state, and the second clock signal /C1 again may be at the high state, thereby turning on the first transistor T1 (shown in FIG. 2) and resulting a low-state voltage of the start pulse Vst being applied to the first node Q (shown in FIG. 9). Thus, the pull-up transistor T35 (shown in FIG. 9) may be turned off. At the same time, the second clock signal /C1 may turn on the second transistor T2 (shown in FIG. 2), thereby applying the high-level voltage VDD to the second node QB and turning on the pull-down transistor T36 (shown in FIG. 9). Thus, the low-level voltage VSS is applied to the output line OUT. Meanwhile, the third node remains at the low state. As a result, during the third period C, the stage may output the low-state output signal OUT.

During a fourth period D, the second clock signal /C1 may be at a low state, thereby turning off the first and second transistors T1 and T2 (shown in FIG. 2). Thus, the first node Q may be floated to its previous low state, to thereby turn off the pull-up transistor T35 (shown in FIG. 9). At the same time, the high-level first clock signal C1 may be applied to the third node P, thereby turning on the second compensating transistor T37. Thus, the low-level voltage VSS may be applied to the first node Q. Accordingly, the first node Q is not floated and the first node Q is prevented from varying along a high-state voltage of the first clock signal C1 by a coupling action of the second parasitic capacitor CGS of the pull-up transistor T35.

Meanwhile, the second transistor T2 (shown in FIG. 2) is turned off by a low-state voltage of the second clock signal /C1 and the fourth transistor T4 (shown in FIG. 2) is turned off by a low state of the first node Q. Thus, the second node QB is floated at a high state lowered than the high-level driving voltage VDD supplied in the previous period C even though the third transistor T3 (shown in FIG. 2) is turned on by a high-state voltage of the first clock signal C1. Thus, the pull-down transistor T36 is at a turn-on state to thereby output the low-level voltage VSS to the output line OUT. As a result, in the D period, the output line of the stage outputs a low-state output signal OUT.

In the remaining period, operations in the C and D periods may be alternately repeated, so that the output signal OUT of the stage can continuously keep a low state without any distortion.

Figure 11:
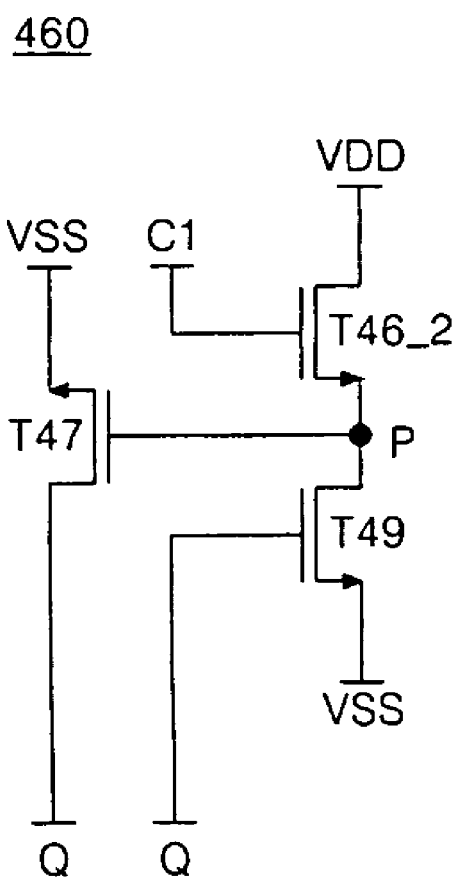
FIG. 11 is a detailed circuit diagram of a compensating circuit according to another embodiment of the present invention.

FIG. 11 is a detailed circuit diagram of a compensating circuit according to another embodiment of the present invention. In FIG. 11, a compensating circuit 460 for compensating for a voltage variation in the first node Q (for example, shown in FIG. 9) may include a first compensating transistor T46_2, a second compensating transistor T47, and a third compensating transistor T49. The first compensating transistor T46_2 may be controlled by the first clock signal C1 and may selectively apply the high-level voltage VDD to a third node P. In addition, the second compensating transistor T47 may be controlled by the voltage at the third node P to selectively apply the low-level voltage VSS to the first node Q. Further, the third compensating transistor T49 may be controlled by the voltage at the first node Q to selectively apply the low-level voltage VSS to the third node P.

As a result, during a first period A, the first compensating transistor T46_2 is turned off by a low-state voltage of the first clock signal C1 and a third compensating transistor T49 is turned on by a high-state first node Q, thereby supplying the low-level voltage VSS to the third node P. Thus, the second compensating transistor T47 is turned off.

During a second period B, the first compensating transistor T46_2 is turned on by a high-state voltage of the first clock signal C1, and the third compensating transistor T49 is turned on by the high-state first node Q. However, since the third compensating transistor T49 is larger than the first compensating transistor T46_2, the third node P is supplied with a low-level voltage VSS through the third compensating transistor T49. Thus, the second compensating transistor T47 remains turned off. A magnitude relationship of the third compensating transistor T49 to the first compensating transistor T46_2 may be a ratio of approximately at least 3:1.

During a third period C, the first compensating transistor T46_2 is turned off by a low-state voltage of the first clock signal C1 and a third compensating transistor T49 is turned off by a low-state first node Q, thereby floating the third node P to the previous low state. Thus, the second compensating transistor T47 remains turned off.

During a fourth period D, the first compensating transistor T46_2 is turned on by a high-state voltage of the first clock signal C1, and the third compensating transistor T49 is turned off by the low-state first node Q. Thus, the high-level voltage VDD is applied to the third node P, thereby turning on the second compensating transistor T47. Accordingly, the second compensating transistor T47 is turned on to supply the low-level voltage VSS to the first node Q, thereby preventing the first node Q from varying due to a high-state voltage of first clock signal C1.

Figure 12:
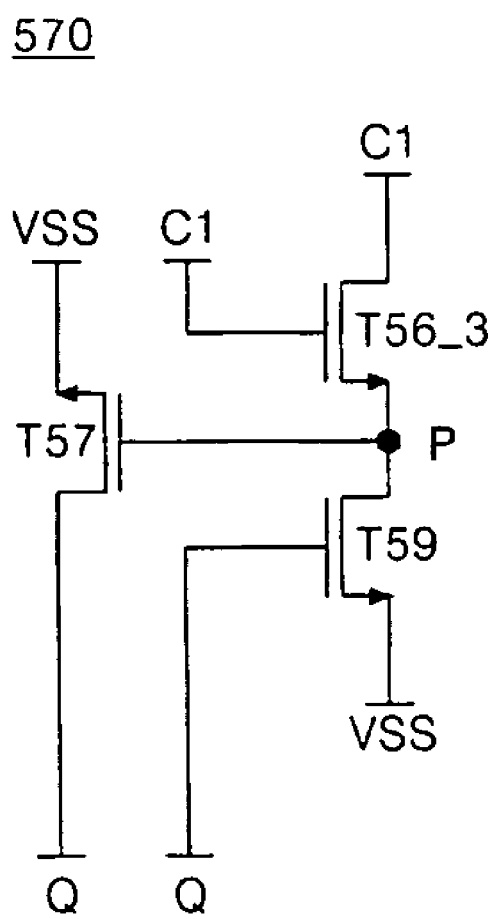
FIG. 12 is a detailed circuit diagram of a compensating circuit according to another embodiment of the present invention.

FIG. 12 is a detailed circuit diagram of a compensating circuit according to another embodiment of the present invention. In FIG. 12, a compensating circuit 570 for compensating for a voltage variation in the first node Q (for example, shown in FIG. 9) may include a first compensating transistor T56_3, a second compensating transistor T57, and a third compensating transistor T59. The first compensating transistor T56_3 may be controlled by the first clock signal C1 and may selectively apply the first clock signal C1 to a third node P. In addition, the second compensating transistor T57 may be controlled by the voltage at the third node P to selectively apply the low-level voltage VSS to the first node Q. Further, the third compensating transistor T59 may be controlled by the voltage at the first node Q to selectively apply the low-level voltage VSS to the third node P.

As a result, during a first period A, the first compensating transistor T56_3 is turned off by a low-state voltage of the first clock signal C1 and a third compensating transistor T59 is turned on by a high-state first node Q, thereby supplying the low-level voltage VSS to the third node P. Thus, the second compensating transistor T57 is turned off.

During a second period B, the first compensating transistor T56_3 is turned on by a high-state voltage of the first clock signal C1, and the third compensating transistor T59 is turned on by the high-state first node Q. However, since the third compensating transistor T59 is larger than the first compensating transistor T56_3, the third node P is supplied with a low-level voltage VSS through the third compensating transistor T59. Thus, the second compensating transistor T57 remains turned off. A magnitude relationship of the third compensating transistor T59 to the first compensating transistor T56_3 may be a ratio of approximately at least 3:1.

During a third period C, the first compensating transistor T56_3 is turned off by a low-state voltage of the first clock signal C1 and a third compensating transistor T59 is turned off by a low-state first node Q, thereby floating the third node P to the previous low state. Thus, the second compensating transistor T57 remains turned off.

During a fourth period D, the first compensating transistor T56_3 is turned on by a high-state voltage of the first clock signal C1, and the third compensating transistor T59 is turned off by the low-state first node Q. Thus, the high-state voltage of the first clock signal C1 is applied to the third node P, thereby turning on the second compensating transistor T57. Accordingly, the second compensating transistor T57 is turned on to supply the low-level voltage VSS to the first node Q, thereby preventing the first node Q from varying due to a high-state voltage of first clock signal C1.

As described above, the shift register according to the present invention prevents the control node Q of the pull-up transistor from being varied along the clock signal using the inverted clock signal and the compensating capacitor/circuit, thereby reducing a distortion of the output voltage. Accordingly, it becomes possible to prevent an erroneous operation of the circuit caused by the distortion in the output voltage.

It will be apparent to those skilled in the art that various modifications and variations can be made in the shift register and the driving method thereof of the present invention without departing from the sprit or scope of the invention. Thus, it is intended that the present invention covers the modifications and variations of this invention provided they come within the scope of the appended claims and their equivalents.

What is claimed is:

1. A shift register having a plurality of stages for shifting a start pulse and outputting a shifted start pulse to a next stage, each of said plurality of stages comprising:
   a pull-up transistor controlled by a first node to apply a first clock signal to an output line;
   a pull-down transistor controlled by a second node to apply a first driving voltage to the output line;
   a controller for controlling the first and second nodes; and
   a compensating circuit connected to the first node, the compensating circuit selectively applying the first driving voltage to the first node based on a voltage at a third node, wherein the voltage at the third node is controlled based on the first node.

2. The shift register according to claim 1, wherein the compensating circuit includes:
   a first compensating transistor control by a second driving voltage to apply the first clock signal to the third node;
   a second compensating transistor controlled by a voltage at the third node to apply the first driving voltage to the first node; and
   a third compensating transistor controlled by a voltage at the first node to apply the first driving voltage to the third node.

3. The shift register according to claim 1, wherein the compensating circuit includes:
   a first compensating transistor controlled by the first clock signal to apply a second driving signal to the third node;
   a second compensating transistor controlled by a voltage at the third node to apply the first driving voltage to the first node; and
   a third compensating transistor controlled by a voltage at the first node to apply the first driving voltage to the third node.

4. The shift register according to claim 1, wherein the compensating circuit includes:
   a first compensating transistor controlled by the first clock signal to apply the first clock signal to the third node;
   a second compensating transistor controlled by a voltage at the third node to apply the first driving voltage to the first node; and
   a third compensating transistor controlled by a voltage at the first node to apply the first driving voltage to the third node.

5. A shift register having a plurality of stages for shifting a start pulse and outputting a shifted start pulse to a next stage, each of said plurality of stages comprising:
   a pull-up transistor controlled by a first node to apply a first clock signal to an output line;
   a pull-down transistor controlled by a second node to apply a first driving voltage to the output line;
   a controller for controlling the first and second nodes; and
   a compensating circuit connected to the first node, the compensating circuit selectively applying the first driving voltage to the first node based on a voltage at a third node, wherein the compensating circuit selectively prevents the first node from being floated.

6. The shift register according to claim 5, wherein the compensating circuit applies the first driving voltage to the first node when the first node is floated.

7. A method of driving a shift register having a plurality of stages for shifting a start pulse and outputting a shifted start pulse to a next stage, each of said plurality of stages including a pull-up transistor controlled by a first node to apply a first clock signal to an output line, a pull-down transistor controlled by a second node to apply a first driving voltage to the output line, a controller for controlling the first and second nodes, and a compensating circuit connected to the first node, comprising:
   selectively applying the first driving voltage to the first node by the compensating circuit based on a voltage at a third node, wherein the voltage at the third node is controlled based on the first node.

8. A method of driving a shift register having a plurality of stages for shifting a start pulse and outputting a shifted start pulse to a next stage, each of said plurality of stages including a pull-up transistor controlled by a first node to apply a first clock signal to an output line, a pull-down transistor controlled by a second node to apply a first driving voltage to the output line, a controller for controlling the first and second nodes, and a compensating circuit connected to the first node, comprising:

selectively applying the first driving voltage to the first node by the compensating circuit based on a voltage at a third node, wherein the first driving voltage is selectively applied to the first node to prevent the first node from being floated.

9. The method of driving a shift register according to claim 8, wherein the step of selectively applying the first driving voltage to the first node is performed when the first node is floated.

10. A driving device for a liquid crystal display panel device, comprising:
   a shift register having a plurality of stages for shifting a start pulse and outputting a shifted start pulse to a next stage, each of said plurality of stages comprising:
   a pull-up transistor controlled by a first node to apply a first clock signal to an output line;
   a pull-down transistor controlled by a second node to apply a first driving voltage to the output line;
   a controller for controlling the first and second nodes; and
   a compensating circuit connected to the first node, the compensating circuit selectively applying the first driving voltage to the first node based on a voltage at a third node, wherein the voltage at the third node is controlled based on the first node.

11. The driving device according to claim 10, wherein the shift register is formed on a glass substrate.

12. The driving device according to claim 10, wherein the output line of each of the plurality of stages is connected to a gate line of a liquid crystal display panel.

* * * * *